(12) United States Patent
Yamaguchi et al.

(10) Patent No.: US 6,491,784 B2
(45) Date of Patent: Dec. 10, 2002

(54) DRY ETCHING DEVICE

(75) Inventors: Akira Yamaguchi, Saitama (JP); Fumitsugu Nakayama, Saitama (JP)

(73) Assignee: Nisshinbo Industries, Inc., Tokyo (JP)

( * ) Notice: Subject to any disclaimer, the term of this patent is extended or adjusted under 35 U.S.C. 154(b) by 0 days.

(21) Appl. No.: 09/900,470

(22) Filed: Jul. 9, 2001

(65) Prior Publication Data

US 2002/0043335 A1 Apr. 18, 2002

(30) Foreign Application Priority Data

Jul. 11, 2000 (JP) ........................................ 2000-209313
Jun. 22, 2001 (JP) ........................................ 2001-189065

(51) Int. Cl.$^7$ ........................... H05H 1/00; C23C 16/00; C23C 14/00
(52) U.S. Cl. ........................... 156/345.34; 156/345.47; 118/723 E; 204/298.31
(58) Field of Search ...................... 156/345.34, 345.47; 118/723 E, 724, 715; 204/298.01, 298.31

(56) References Cited

U.S. PATENT DOCUMENTS

| | | | |
|---|---|---|---|
| 5,074,456 A | | 12/1991 | Lilleland et al. |
| 5,391,433 A | * | 2/1995 | Kawakubo et al. .......... 428/408 |
| 5,620,812 A | * | 4/1997 | Tahara et al. ............... 429/223 |
| 5,951,814 A | * | 9/1999 | Saito et al. .................. 156/345 |
| 6,073,577 A | | 6/2000 | Degner et al. |
| 6,083,644 A | * | 7/2000 | Watanabe et al. ......... 429/231.1 |
| 6,195,582 B1 | * | 2/2001 | Scott et al. .................... 604/20 |

FOREIGN PATENT DOCUMENTS

JP  2001-15152 A * 1/2001 .......... H01M/10/36

* cited by examiner

Primary Examiner—Gregory Mills
Assistant Examiner—P. Hassanzadeh
(74) Attorney, Agent, or Firm—Armstrong, Westerman & Hattori, LLP

(57) ABSTRACT

It is an object of the present invention to provide an upper electrode which is prevented from being contaminated with an impurity, has a sufficient adhesive strength between the pedestal and electrode plate of silicon, secures high-precision parallelism with the lower electrode, and hence improves the etching characteristics and silicon wafer yield. It is another object of the present invention to provide a dry etching device equipped with the upper electrode. The present invention provides an upper electrode for dry etching devices, comprising an electrode plate of silicon which is supported by a pedestal, wherein (a) the pedestal is made of graphite, and (b) the electrode plate of silicon is joined to the pedestal by an organic adhesive containing a filler having a Young's modulus of $6 \times 10^9$ to $68 \times 10^9 N/m^2$.

6 Claims, 2 Drawing Sheets

- 11: Etchant gas ejecting hole
- 8: Electrode plate of silicon
- 10: Joint (joint face)
- 9: Pedestal (ring) of graphite

- 11: Etchant gas ejecting hole
- 8: Electrode plate of silicon
- 10: Joint (joint face)
- 9: Pedestal (ring) of graphite

DRY ETCHING DEVICE

BACKGROUND OF THE INVENTION

1. Field of the Invention

This invention relates to an upper electrode for dry etching devices for production of semiconductor devices and the dry etching device including the same, more particularly to an upper electrode which is prevented from being contaminated with an impurity, has a sufficient adhesive strength between the pedestal and electrode plate of silicon, secures high-precision parallelism with the lower electrode, and hence improves the etching characteristics and silicon wafer yield, and to the dry etching device including the same.

2. Description of the Prior Art

As information devices represented by computers advance, the semiconductor integrated circuit as the main component of these devices is increasingly required to have a higher degree of integration. In the production of a semiconductor device, its components as well as the stock materials are handled in a clean working atmosphere, e.g., in a clean room, for securing the performance requirements, because the device is extremely sensitive to contamination with an impurity. It is needless to say that each component is required not to produce an impurity.

The wafer treatment processes, represented by ion implantation, dry etching and sputtering, are effected in a reaction chamber, frequently referred to simply as a chamber, which can be evacuated to a high degree of vacuum. The chamber is increasingly required to meet the higher purity standards, as degree of integration increases for semiconductor integrated circuits.

Taking dry etching as an example, the component members inside of the chamber are described by referring to FIG. 3. The chamber normally includes a pair of electrodes, i.e., upper and lower electrodes, facing each other, the lower electrode being connected to an RF power source to produce a plasma between the counter electrodes. A silicon wafer is set immediately above the lower electrode via a mounting member, to be etched with an etchant gas in a plasma atmosphere.

The conventional upper electrode for a dry etching device is composed of an electrode plate of silicon which is joined to a pedestal (or support ring) of metal or metal oxide by brazing with indium or the like.

However, pedestals of metal or metal oxide tend to be contaminated with an impurity, and graphite has been investigated as a substitute for the metal or metal oxide. Joining the electrode plate to a graphite pedestal by brazing with indium or the like, although securing the necessary adhesive strength, not only requires time-consuming pretreatment and work at high temperature during the production period but also causes distribution of joint layer thickness, making it difficult to have the sufficient parallelism between the upper and lower electrodes necessary for uniform etching treatment, and hence this method is unsuitable for joining members required to have highly precision parallelism. The brazing metal itself may cause contamination of the silicon wafer. Therefore, the joining method rarely gives good etching characteristics for dry etching, and tends to lower the yield of the semiconductor device or silicon wafer.

Several attempts have been made to solve these problems. For example, U.S. Pat. No. 5,074,456 proposes an upper electrode joined using metal-filled epoxies, and U.S. Pat. No. 6,073,577 proposes an upper electrode joined using a metal particle-containing elastomeric materials.

These references state that the electrode plate and pedestal can be joined to each other more precisely, because of decreased thickness of the adhesive layer to a size of the metal particles, keeping good parallelism between the upper and lower electrodes and avoiding contamination with an impurity.

However, these inventions have a lower thermal conductivity between the electrode plate and pedestal, in spite of the metallic filler present in the adhesive layer, than the case where they are joined by a brazing material, possibly causing a temperature distribution between the electrode plate periphery and center, and hence deteriorating the etching characteristics.

SUMMARY OF THE INVENTION

It is an object of the present invention to provide an upper electrode which is prevented from being contaminated with an impurity, secures not only high-precision parallelism with the lower electrode but also good thermal conductance between the electrode plate and pedestal, and hence improves the etching characteristics and silicon wafer yield by solving the problems involved in the conventional upper electrode for dry etching devices, and also to provide the dry etching device including the same.

The inventors of the present invention have found, after extensive study to develop the optimum upper electrode for dry etching devices in order to solve the above problems, that good thermal conductance can be realized between the electrode and pedestal when graphite, which is prevented from being contaminated with an impurity, is used as the material for the pedestal and joined to the electrode plate of silicon by an organic adhesive containing a specific filler, reaching the present invention.

The first invention provides an upper electrode for dry etching devices, comprising an electrode plate of silicon which is supported by a pedestal, wherein
 (a) the pedestal is made of graphite, and
 (b) the electrode plate of silicon is joined to the pedestal by an organic adhesive containing a filler having a Young's modulus of $6 \times 10^9$ to $68 \times 10^9$ N/m$^2$.

The second invention provides an upper electrode which is the same as that of the first invention except that the pedestal is coated with glass-like carbon for the portion not joined to the electrode plate of silicon.

The third invention provides an upper electrode which is the same as that of the first invention wherein the electrode plate of silicon is pressed to the pedestal via the organic adhesive containing beforehand an electrically and thermally conductive filler of uniform particle size at a pressure determined by the correlation between adhesion pressure and filler particle size, in order to control the joint layer at a uniform thickness.

The fourth invention provides an upper electrode which is the same as that of one of the first to third first inventions wherein the filler is of graphite and contained in said organic adhesive at 5 to 30% by weight.

The fifth invention provides an upper electrode which is the same as that of one of the first to fourth inventions wherein the organic adhesive is a silicone-based one.

The sixth invention provides a dry etching device which includes the upper electrode of one of the first to fifth inventions.

The present invention relates to an upper electrode which is prevented from being contaminated with an impurity, secures not only high-precision parallelism with the lower electrode but also good thermal conductance between the electrode plate and pedestal, and hence improves the etching characteristics and silicon wafer yield, and also to provide the dry etching device including the same as described above. The preferred embodiments of the invention includes the followings:

(1) The upper electrode for dry etching devices according to one of the first through fifth invention, wherein the organic adhesive is an epoxy-base or a silicon-base adhesive.

(2) The upper electrode of the above for dry etching devices, wherein the organic adhesive is an epoxy- or silicone-based one incorporated with at least one type of filler having a Young's modulus of $6 \times 10^9$ to $68 \times 10^9$ N/m².

(3) The upper electrode of the above for dry etching devices, wherein the organic adhesive is of the one-pack type.

(4) The upper electrode of the above for dry etching devices according to the second invention, wherein the pedestal is coated with glass like carbon to a thickness of at least 1 to 3 µm.

Figure 1:
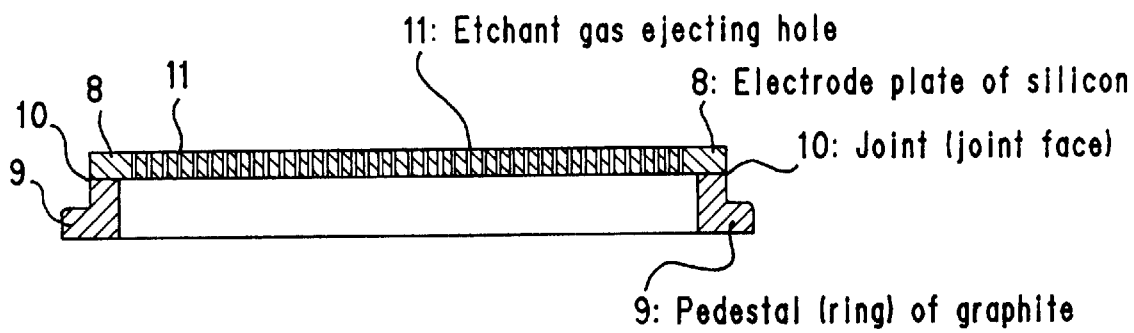
FIG. 1 schematically illustrates the upper electrode.

Notation
1 Etchant gas inlet nozzle
2 Discharge nozzle
3 Upper electrode
4 Lower electrode
5 Silicon wafer
6 Plasma
7 RF power source
8 Electrode plate of silicon
9 Pedestal (ring) of graphite
10 Joint (joint face)
11 Etchant gas ejecting hole

DETAILED DESCRIPTION OF THE INVENTION

1. Electrode Plate

The upper electrode for dry etching devices normally comprises an electrode plate of silicon, which is in the form of disk having a number of holes on the plate surface, through which the etchant gas is ejected. The etchant gas is converted into plasma while passing through the holes in the upper electrode, and the silicon wafer set on the lower electrode is etched with the reactive ions it attracts from the plasma.

Silicon serving as the base for the electrode plate is not limited, but preferably single-crystalline, highly pure and dense silicon is used. One of the examples of such silicon is P-type single-crystal silicon doped with boron (B), having the crystal orientation of <100>. Its resistivity is normally in a range from 1 µΩ•cm to 30 Ω•cm.

2. Pedestal

The upper electrode of the present invention for dry etching devices is supported by a pedestal (or support ring) of graphite which comes into contact with the back side of the electrode plate of silicon. The pedestal of graphite brings the effect of cooling the heat generated at the upper electrode (the thermal conducting effect), while being kept away from the contamination during the etching process with an impurity in the silicon wafer.

The pedestal of graphite, also serving as the cooling ring, is preferably, or should be highly heat conducting (having a high heat conductivity) and small in difference in thermal expansion coefficient with the electrode plate of silicon. Otherwise, there is a temperature gradient between the disk center and periphery of the electrode, which can be one of the causes for uneven etching characteristics. The pedestal of low heat conductivity and largely different from the electrode plate in thermal expansion coefficient may not well cope with the requirements for, e.g., increasing silicon wafer size, increasing treatment temperature, or adoption of rapidly heating/cooling cycles.

Graphite serving as the base for the pedestal is not limited, but preferably highly pure to cause no contamination with an impurity during the silicon wafer etching process, and to have a high thermal conductivity and small difference in thermal expansion coefficient with the electrode plate of silicon. One of the examples of such graphite is the semiconductor-grade one, and the commercial products include CX-2123, CX-2114, CX-2206 and E+25 (LE-CARBON E ), and EGF-262 and EGF-264 (Nippon Carbon).

The pedestal of graphite may be of a composite of graphite and glass-like carbon.

It is preferable that the graphite surface is coated with glass-like carbon, at least for the portion exposed to the etchant gas during the dry etching process, i.e., the portion other than that joined to the electrode plate of silicon. The portions include the side and back of the pedestal.

The graphite surface is coated with glass-like carbon normally to a thickness of 1 to 3 µm. The coating method is not limited, and may be adequately selected from the conventional ones. In particular, the preferable ones include to coat the graphite with a certain type of resin, e.g., polycarbodiimide or phenolic resin by spraying or impregnation, and fire the resin into the glass like carbon.

When the impregnation treatment is adopted, the glass-like carbon may be formed also from the pedestal surface to the inside, and thickness of the whole glass-like carbon layer can be increased to 3 µm or more.

The glass-like carbon layer works as the protective layer for the graphite, controlling formation of dust from the graphite and making it more resistant to corrosion. In particular, it controls release of the gas from the graphite in the plasma atmosphere during the dry etching process, and prevents contamination of the wafer with, e.g., particles of the substances that constitute the oxide layer, separated from the graphite surface and deposited on the wafer.

Glass-like carbon is also referred to as non-graphitizable carbon or hard carbon. It is not limited with respect to the stock or production method, so long as it is produced by solid-phase carbonization of an organic substance. The stocks for glass-like carbon include cellulose, thermosetting resins, e.g., furfuryl alcohol, and thermoplastic resins. Various methods have been proposed to produce glass-like carbon from these stock materials.

3. Joint

The upper electrode of the present invention for dry etching devices comprises the above-described electrode plate of silicon and pedestal (support ring) of graphite joined to the back side of the electrode plate.

The joint layer comprises an organic adhesive which contains an electrically and thermally conductive filler of uniform particle size, and is controlled to have a uniform thickness determined by the correlation between adhesion pressure and filler particle size.

The organic adhesive for the present invention is normally a thermosetting epoxy or silicon based one. The silicone-based one is preferable, because it loses no adhesive force even when the electrode plate thermally expands. The filler to be incorporated in the organic adhesive is thermally and electrically conductive, and having a Young's modulus of elasticity of $6 \times 10^9$ to $68 \times 10^9$ N/m². Incorporation of such a filler provides the organic adhesive with a thermal conductivity roughly 10 times higher than that of an epoxy or silicon resin. At the same time, filler will collapse when the electrode plate is joined to the pedestal, to secure two-dimensional contact between the electrode and pedestal and between the filler particles, even when the adhesive expands by the heat from the upper electrode, thereby improving thermal conductance between the electrode and pedestal.

The concrete examples of the filler materials useful for the present invention include graphite, indium, tin, lead and solder. A metallic brazing material for joining generally causes contamination with an impurity. However, the metallic brazing material rarely causes serious contamination, because it consists of particles which are contained in the adhesive. Of these, indium and graphite are more preferable because they are comparable with or lower than the pedestal of graphite in Young's modulus ($20 \times 10^9$ N/m² or less), and graphite (carbon) is still more preferable because it is compatible with the adhesive and will not greatly deteriorate adhesive force of the adhesive. The filler particle size is 1 to 100 μm, preferably 10 to 50 μm, and the particle size distribution is preferably relatively narrow. It is incorporated at 5 to 30% by weight in the case of graphite and 17 to 70% by weight in the case of metal, based on the adhesive.

It is recommended that the pedestal be pre-coated with a primer. The primer useful for the present invention is not limited so long as it improves adhesive force of the adhesive to the graphite pedestal. In particular, a primer composed of a silicon compound solution can help the silicone-based adhesive penetrate into the inside of graphite for the pedestal, improving not only adhesive force but also thermal conductance between the electrode plate and pedestal.

When the organic adhesive incorporated with a filler of uniform particle size is cured under a joining pressure, thickness of the joint layer is the same as the particle size from the relationship between pressure and filler particle size, making the joint layer thickness uniform and securing the original parallelism between the upper and lower electrodes.

The relationships of pressure with filler particle size (radius) and filler particle number at the joint are derived from the elastic contact theorem.

How many filler particles are required for an adhesion load for joining can be determined by calculating the maximum surface pressure generated between the filler and silicon plate and between the filler and graphite, and keeping the pressure not exceeding the allowable stress of the filler, silicon or graphite. One example is given below.

According to the elastic contact theorem of Hertz, the maximum surface pressure ($P_{max}$) generated between two objects coming into contact with each other is given by the formula (1):

$$P_{max} = 1.5 \times P_0/(\pi a^2) \tag{1}$$

wherein, $P_0$ is adhesion load generated on each filler particle, and "a" is a contact face radius, given by the following formula (2):

$$a = 0.88 \times (4 P_0 R^* / E^*)^{1/3} \tag{2}$$

wherein, $E^*$ is equivalent Young's modulus, and $R^*$ is equivalent radius, which are represented by the following formulae, respectively:

$$1/E^* = (1/E_1) + (1/E_2) \tag{3}$$

$$1/R^* = (1/R_1) + (1/R_2) \tag{4}$$

wherein, $E_1$ and $E_2$ are each Young's modulus of object 1 and 2, and $R_1$ and $R_2$ are each radius of object 1 and 2.

The relationship between adhesion load (P) and number of filler particles (N) is given by the following formula (5):

$$P = P_0 XN \tag{5}$$

These formulae (1) to (5) give number of filler particles required for adhesion load to equalize joint layer thickness with filler size during the adhesion process.

Assuming, for example, a pressing load of 10 kg is applied to the upper face of the silicon plate supported by the graphite pedestal with the filler having a number-average particle size of 50 μm in-between to have the 50 μm thick joint layer, the graphite filler particles having a particle size larger than 50 μm will collapse, and a number of the graphite filler particles required to support the load of 10 kg is calculated to be approximately $9.7 \times 10^5$. In other words, the joint layer of 50 μm in thickness can be obtained, when the graphite filler particles are dispersed to approximately $9.7 \times 10^5$.

Use of the graphite pedestal and securing uniform thickness for the joint layer prevent contamination of the upper electrode with an impurity and realizes high-precision parallelism between the upper and lower electrodes, thereby improving the etching characteristics and hence silicon wafer production yield.

EXAMPLE

The present invention is described in more detail by EXAMPLES using drawings and COMPARATIVE EXAMPLE, which by no means limit the present invention.

Example 1

Outline of the Upper Electrode and Joining Method

The upper electrode of the present invention is one component of a dry etching device for production of silicon wafers. The etching device is outlined in FIG. 3, and the upper electrode in FIGS. 1 and 2.

Figure 2:
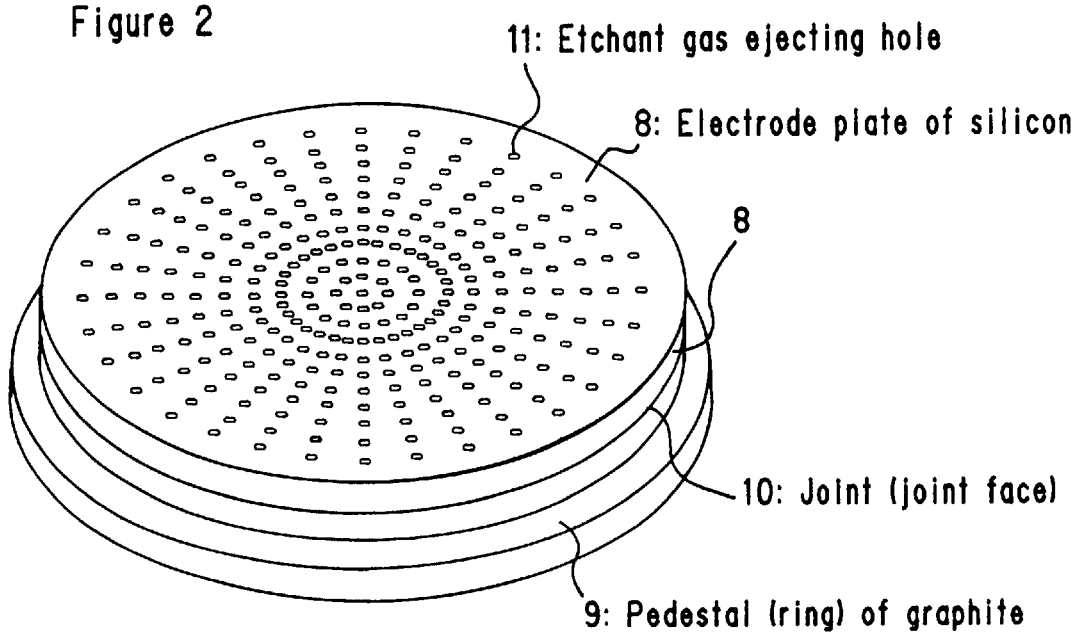
FIG. 2 presents the oblique view of the upper electrode.
Figure 3:
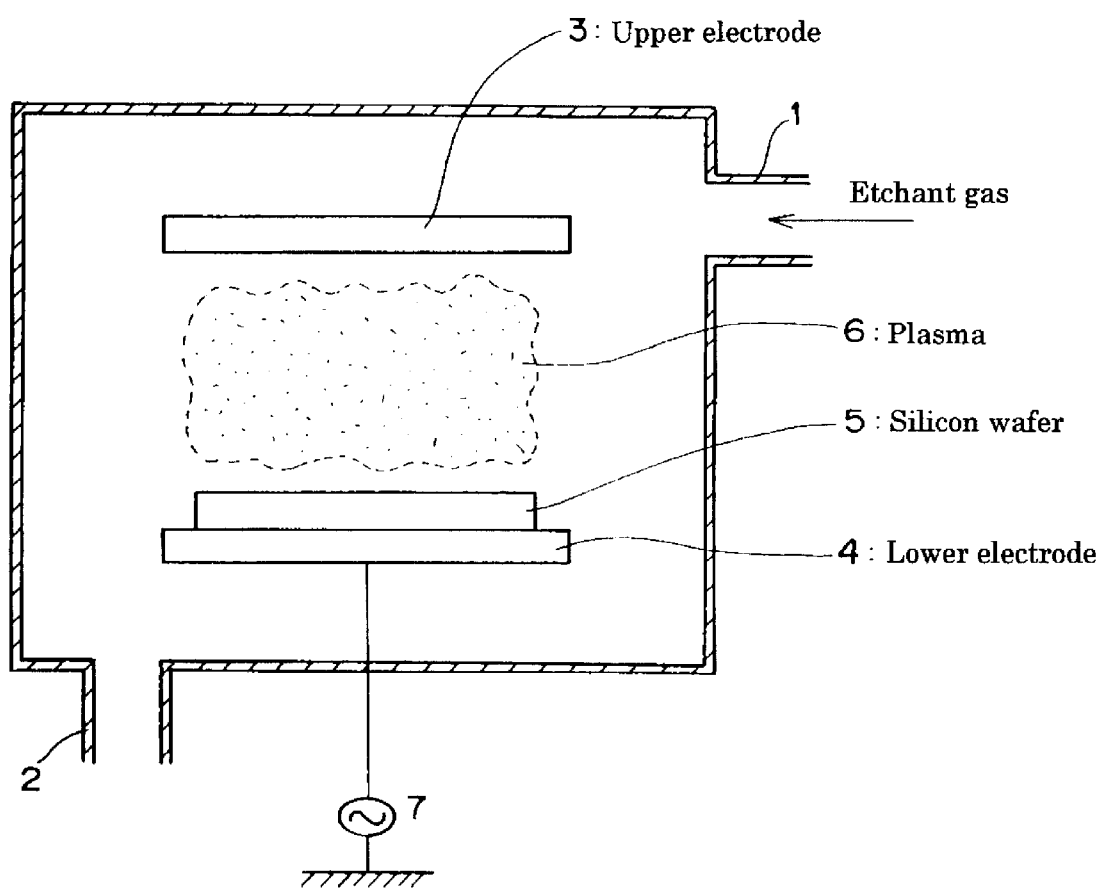
FIG. 3 schematically illustrates the dry etching device.

Referring to FIGS. 1 and 2, the electrode plate 8 of silicon had dimensions of 223.5 mm in diameter and 6.3 mm in thickness, 3249 etchant gas ejecting holes (diameter: 0.84 mm), and a parallelism of 0.01. The graphite ring (pedestal) 9 had dimensions of 223.5 mm in outer diameter, 203.2 mm in inner diameter, 68 cm² in contact area, 19 mm in thickness, and 245 mm and 8.9 mm in outer diameter and thickness of the lower side, and a parallelism of 0.02.

The electrode plate 8 of silicon was joined to the graphite ring 9 via the joint 10, to form the upper electrode.

The joint 10 comprised a silicone adhesive as the organic adhesive, one-pack type, room-temperature curable (RTV), moisture-curable (cured by reacting moisture in air) and highly thermoconductive (Shin-Etsu Kagaku Kogyo, trade name: KE3490), incorporated with graphite particles as the filler (ASBURY GRAPHITE MILLS, trade name: #4424, average particle size: 40 μm, specific gravity: 1.8). For the preparation of the filler, 500 g of the silicone-based adhesive and 150 g of the graphite were stirred in a beaker for 10 minutes, while keeping air away as far as possible. The pedestal graphite surface, to be joined to the electrode plate, was pre-coated with a primer (Shin-Etsu Kagaku Kogyo, trade name: Primer C), and 0.6 g of the mixed adhesive containing 25% by weight of the graphite was used to join the electrode plate 8 of silicon to the graphite ring 9, wherein the assembly was allowed to stand for 2 days with a weight of 10 kg placed thereon. The adhered assembly had a 70 μm thick adhesive layer, and parallelism of 0.02.

The upper electrode thus prepared was used as the component for a dry etching device for production of silicon wafers.

Comparative Example 1

An upper electrode was prepared in the same manner as in EXAMPLE 1, except that the graphite was replaced by a mixed adhesive containing 27% by weight of a filler of aluminum alloy (specific gravity: 2.7) containing 15% of silicon (volumetric ratio of the filler was the same as that for the mixed adhesive for EXAMPLE 1).

Examples 2 and 3

An upper electrode was prepared in each of EXAMPLES 2 and 3 in the same manner as in EXAMPLE 1, except that graphite was incorporated in the mixed adhesive at 2 and 10% by weight, respectively.

Examples 4 to 6

An upper electrode was prepared in each of EXAMPLES 4 to 6 in the same manner as in respective EXAMPLES 1 to 3, except that pre-coating with the primer was not effected.

Example 7

An upper electrode was prepared in the same manner as in EXAMPLE 1, except that the graphite was replaced by a mixed adhesive containing 50% by weight of a filler of indium (specific gravity: 7.3) (volumetric ratio of the filler was the same as that for the mixed adhesive for EXAMPLE 1).

Example 8

An upper electrode was prepared in the same manner as in EXAMPLE 1, except that the silicone-based adhesive was replaced by an epoxy-based one.

Table 1 gives thermal conductivity, tensile strength and etching characteristics of the upper electrodes prepared by EXAMPLES and COMPARATIVE EXAMPLES. The evaluation items were measured and evaluated by the following procedures:

Thermal conductivity

The joint was cut off from each upper electrode and prepared in such a way that each of the electrode silicon and pedestal graphite had a thickness of 2mm, to measure thermal conductivity between the silicon and graphite by the laser flash method (measurement temperature; 100° C.) using a thermal constant analyzer (shinku Riko, TC-3000).

Tensile strength

Tensile strength was measured using an autograph (Shimadzu, AG-2).

Etching characteristics

Each upper electrode was used to etch a silicon wafer by a plasma etching device (Ram Research, 4520XLE) under conditions to etch at a rate of 7520Å/minute at the silicon wafer center with the upper electrode prepared in EXAMPLE 1, and etching rates at five points on the silicon wafer were measured, to determine uniformity (Unif) of etching rate from the maximum (Max.), minimum (Min.) and average (Ave.) rates by the relationship Unif=(Max.−Min.)/(2×Ave.)×100. The sample has more uniform etching rate as the value Unif decreases.

TABLE 1

| | EXAMPLE | | | | | | | | COMPARATIVE EXAMPLE |
|---|---|---|---|---|---|---|---|---|---|
| | 1 | 2 | 3 | 4 | 5 | 6 | 7 | 8 | 1 |
| Filler | Graphite | Graphite | Graphite | Graphite | Graphite | Graphite | Indium | Graphite | Si—Al |
| Average particle size (μm) | 40 | 40 | 40 | 40 | 40 | 40 | 40 | 40 | 40 |
| Content in adhesive (wt %) | 25 | 20 | 10 | 25 | 20 | 10 | 20 | 20 | 27 |
| Adhesive | Silicone | Silicone | Silicone | Silicone | Silicone | Silicone | Silicone | Epoxy | Silicone |
| Primer | Yes | Yes | Yes | No | No | No | Yes | Yes | Yes |
| Thermal conductivity (W/m · K) | 22 | 20 | 14 | 20 | 18 | 13 | 16 | 20 | 8 |
| Tensile strength (N/m$^2$) | $1.8 \times 10^6$ | $2.2 \times 10^6$ | $2.4 \times 10^6$ | $1.6 \times 10^6$ | $1.8 \times 10^6$ | $2.0 \times 10^6$ | $1.4 \times 10^6$ | $2.2 \times 10^6$ | $1.3 \times 10^5$ |
| Etching characteristics (%) | 2 | 3 | 5 | 3 | 7 | 8 | 6 | 3 | 10 |

The upper electrode of the present invention has a higher thermal conductivity and adhesive strength than the one which uses an adhesive containing aluminum alloy filler. It also has excellent etching characteristics, as revealed by the tests of dry etching of commercial silicon wafers. As such, it is an excellent upper electrode capable of improving chip production yield.

The upper electrode of the present invention for dry etching devices has the effects of preventing itself from being contaminated with an impurity, securing high-precision parallelism with the lower electrode, and hence improving the if etching characteristics. As a result, it can improve semiconductor device yield and contribute to production cost reduction.

What is claimed is:

1. An upper electrode for dry etching devices, comprising an electrode plate of silicon which is supported by a pedestal, wherein
   (a) said pedestal is made of graphite, and
   (b) said electrode plate of silicon is joined to the pedestal by an organic adhesive containing a filler having a Young's modulus of elasticity of $6 \times 10^9$ to $68 \times 10^9$ N/m$^2$.

2. The upper electrode for dry etching devices according to claim 1, wherein said pedestal is coated with glass like carbon for the portion not joined to said electrode plate of silicon.

3. The upper electrode for dry etching devices according to claim 1, wherein said electrode plate of silicon is pressed to said pedestal via the organic adhesive containing beforehand an electrically and thermally conductive filler of uniform particle size at a pressure determined by the correlation between adhesion pressure and filler particle size, in order to control the joint layer at a uniform thickness.

4. The upper electrode for dry etching devices according to one of claims 1 to 3, wherein said filler is of graphite and contained in said organic adhesive at 5 to 30% by weight.

5. The upper electrode for dry etching devices according to one of claims 1 to 3, wherein said organic adhesive is a silicone-based adhesive.

6. A dry etching device which includes one of the upper electrode of one of claims 1 to 3.

* * * * *